(12) United States Patent
Inaba

(10) Patent No.: US 7,723,822 B2
(45) Date of Patent: May 25, 2010

(54) MEMS ELEMENT HAVING A DUMMY PATTERN

(75) Inventor: Satoshi Inaba, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 428 days.

(21) Appl. No.: 11/300,585

(22) Filed: Dec. 15, 2005

(65) Prior Publication Data

US 2007/0069342 A1    Mar. 29, 2007

(30) Foreign Application Priority Data

Sep. 13, 2005    (JP)    ............... 2005-265341

(51) Int. Cl.
*H01L 29/00*    (2006.01)
*H01G 5/16*    (2006.01)

(52) U.S. Cl. .............. 257/532; 257/522; 257/E27.006; 257/E27.048; 361/290

(58) Field of Classification Search ................ 257/532, 257/522, E27.006, E27.048; 361/271, 277, 361/278, 292, 281, 283.2, 290
See application file for complete search history.

(56) References Cited

U.S. PATENT DOCUMENTS

| | | | |
|---|---|---|---|
| 6,355,498 B1 | 3/2002 | Chan et al. | |
| 6,359,374 B1 | 3/2002 | Dausch et al. | |
| 6,362,018 B1 * | 3/2002 | Xu et al. | 438/50 |
| 6,377,438 B1 | 4/2002 | Deane et al. | |
| 2005/0168910 A1 * | 8/2005 | Won et al. | 361/277 |
| 2005/0170637 A1 * | 8/2005 | Chou | 438/626 |
| 2006/0017533 A1 * | 1/2006 | Jahnes et al. | 335/78 |
| 2007/0025050 A1 * | 2/2007 | Shimanouchi et al. | 361/277 |

* cited by examiner

*Primary Examiner*—Shouxiang Hu
(74) *Attorney, Agent, or Firm*—Foley & Lardner LLP

(57)    ABSTRACT

A first electrode is formed on a semiconductor substrate. A second electrode is formed separately at a predetermined interval from the first electrode, and has at least one opening. An actuator layer is connected to the second electrode, and drives the second electrode.

19 Claims, 11 Drawing Sheets

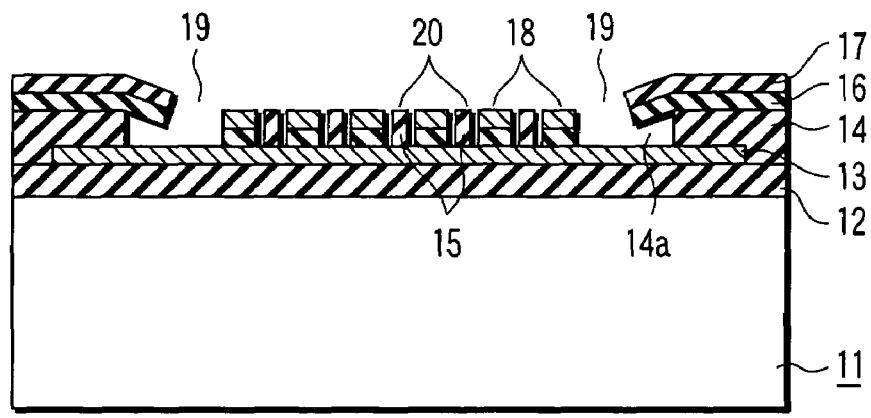
F I G. 3
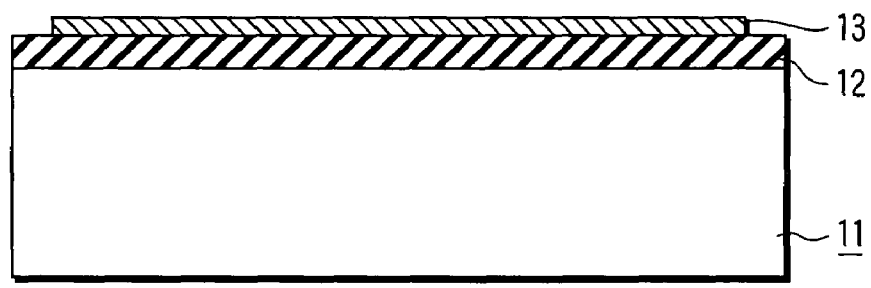
F I G. 4
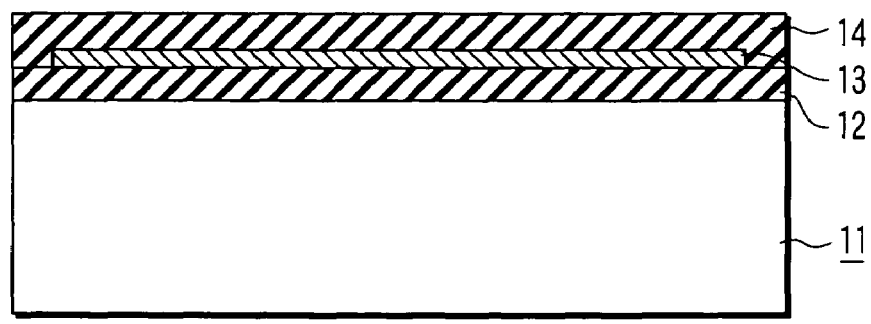
F I G. 5

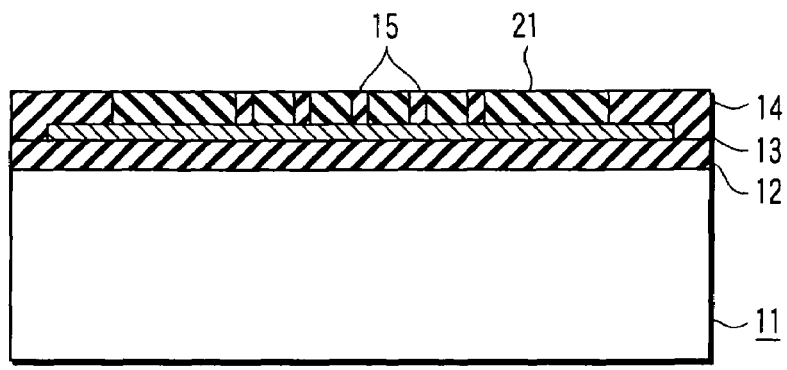
F I G. 9
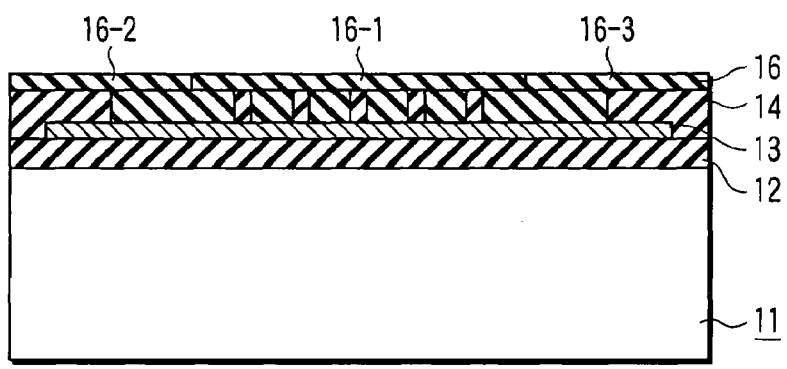
F I G. 10
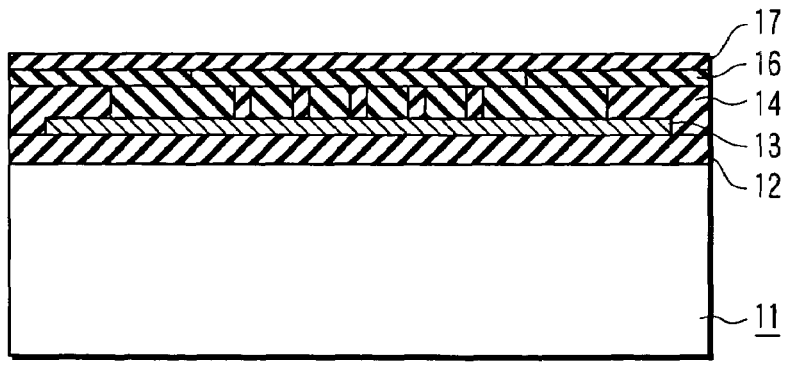
F I G. 11

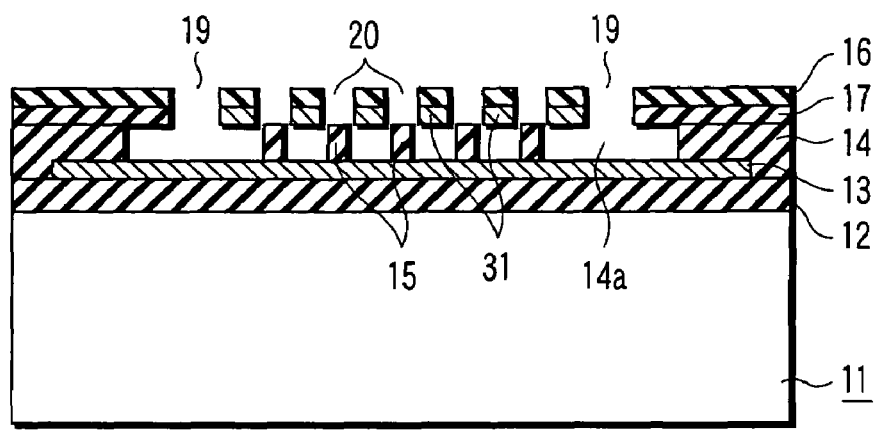
F I G. 30
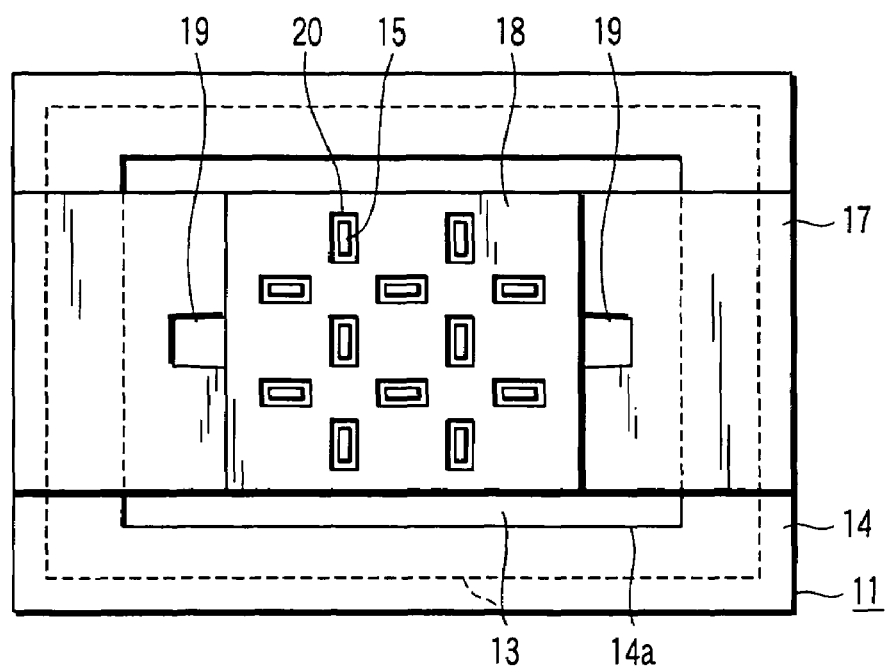
F I G. 31

MEMS ELEMENT HAVING A DUMMY PATTERN

CROSS-REFERENCE TO RELATED APPLICATIONS

This application is based upon and claims the benefit of priority from prior Japanese Patent Application No. 2005-265341, filed Sep. 13, 2005, the entire contents of which are incorporated herein by reference.

BACKGROUND OF THE INVENTION

1. Field of the Invention

The present invention relates to a semiconductor device having, for example, a Micro-Electro-Mechanical Systems (MEMS) element and its manufacturing method.

2. Description of the Related Art

Recently, the MEMS element having a minute movable unit formed by using a semiconductor manufacturing process on a silicon substrate is developed. This MEMS element is applied to, for example, a variable capacitor, an inductor, a switch, a sensor, a gyroscope, a mirror device, etc. As an actuator for constituting the MEMS element, there are, for example, an actuator using a static electricity, and an actuator using a piezoelectric film. A variable capacitor or a relay using these actuators have been developed (refer to, for example, U.S Pat. No. 6,377,438, U.S Pat. No. 6,359,374).

In the variable capacitor using the actuator including, for example, a piezoelectric film, an actuator layer is provided on a lower electrode. An upper electrode is provided on this actuator layer. It is ideal if this upper electrode and the lower electrode are parallel to each other. Further, it is preferable that the upper electrode and the lower electrode are disposed separately at a predetermined interval. However, as will be described below, it is difficult to constitute a variable capacitor of such ideal shape.

The variable capacitor is manufactured as follows. First, an insulating film is deposited on a substrate. A first electrode is formed as the lower electrode on this insulating film. Then, an interlayer insulating film is formed and an opening for exposing the first electrode is formed in this interlayer insulating film. Then, a filling material to become a sacrificial layer is deposited on the whole surface. Then, this filling material is planarized, and the opening is filled with the filling material. As a planarizing method, reactive ion etching (RIE), or a chemical mechanical polishing (CMP) is used. To assure the uniformity of the film thickness, the CMP is preferable. Thereafter, the actuator layer including a piezoelectric film is formed on the interlayer insulating film including the sacrificial layer. Subsequently, a second electrode is formed as the upper electrode on a portion corresponding to the sacrificial layer of the actuator layer. Finally, the sacrificial layer is removed.

However, when the sacrificial layer is planarized by the CMP, a phenomenon called dishing occurs if the opening is a wide pattern. Therefore, the front surface of the sacrificial layer filled in the opening is overetched. Thus, the front surface of the sacrificial layer becomes recessed. When the sacrificial layer is finally etched, the actuator layer is suspended in the opening. The second electrode and the first electrode cannot be arranged in parallel with each other. The mutual interval between the first and second electrodes is narrowed as compared with a designed value. Thus, it becomes difficult to acquire a required capacity. Further, there is another problem that the movable range of the second electrode is reduced.

Furthermore, when dishing arises on the front surface of the sacrificial layer, there is a possibility of a problem arising even in the case of etching the sacrificial layer. That is, when the sacrificial layer is etched, wet etching is frequently used. The actuator layer is suspended in the opening and the interval between the first electrode and the second electrode is narrowed. Then, a phenomenon called sticking due to a surface tension arises at the end of the wet etching. There is another problem that the actuator layer is adhered to the first electrode.

BRIEF SUMMARY OF THE INVENTION

According to a first aspect of the invention, there is provided a semiconductor device comprising: a first electrode formed on a semiconductor substrate; a second electrode formed by being separated at a predetermined interval from the first electrode, the second electrode having at least one opening; and an actuator layer connected to the second electrode, the actuator layer driving the second electrode.

According to a second aspect of the invention, there is provided a method of manufacturing a semiconductor device comprising: forming at least one dummy pattern on a semiconductor substrate; covering the dummy pattern with a filling material; planarizing of the front surface of the filling material in height equivalent to the dummy pattern; forming an actuator layer on the filling material; forming a first opening at a position corresponding to the filling material of the actuator layer; removing the filling material from the first opening; and forming at least one second opening capable of being inserted by the dummy pattern at the position corresponding to the dummy pattern.

According to a third aspect of the invention, there is provided a method of manufacturing a semiconductor device comprising: forming at least one dummy pattern on a semiconductor substrate; covering the dummy pattern with a filling material; planarizing the front surface of the filling material in height equivalent to the dummy pattern; forming an actuator layer on the filling material; forming a first opening at a position corresponding to the filling material of the actuator layer; removing the filling material from the first opening; and removing the dummy pattern from the first opening.

BRIEF DESCRIPTION OF THE SEVERAL VIEWS OF THE DRAWING

FIG. 3 is a sectional view showing an operating state of the semiconductor device shown in FIG. 2;

FIG. 4 is a sectional view showing a method of manufacturing a semiconductor device according to the first embodiment;

FIG. 5 is a sectional view showing a manufacturing process following FIG. 4;

FIG. 9 is a sectional view showing a manufacturing process following FIG. 8;

FIG. 10 is a sectional view showing a manufacturing process following FIG. 9;

FIG. 11 is a sectional view showing a manufacturing process following FIG. 10;

FIG. 30 is a sectional view showing a modification of the first embodiment and showing the case that the first embodiment is applied to a switch; and FIG. 31 is a plan view showing a modification of the first embodiment.

DETAILED DESCRIPTION OF THE INVENTION

Hereinafter, the embodiments of the present invention will be described with reference to the drawings.

First Embodiment

Figure 1:
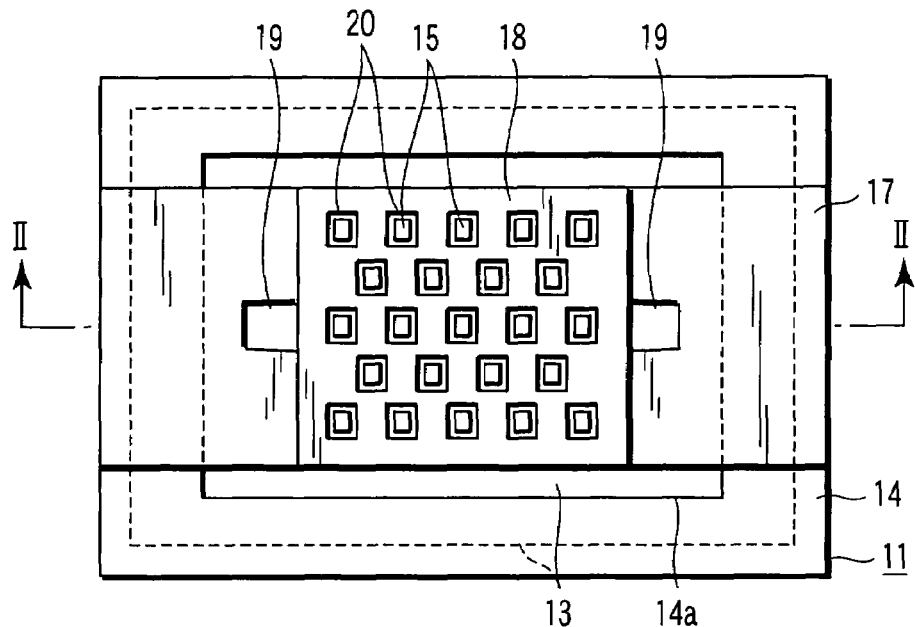
FIG. 1 is a plan view showing a semiconductor device according to a first embodiment.
Figure 2:
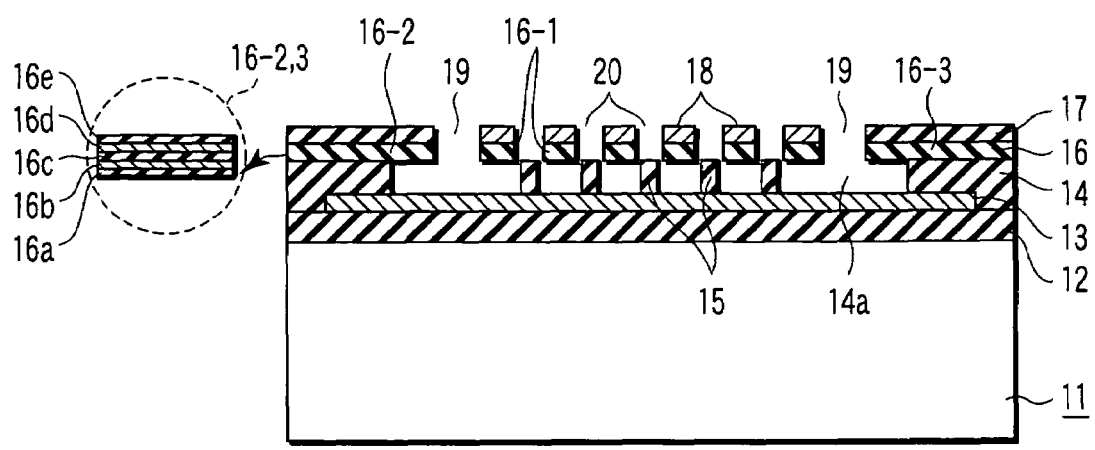
FIG. 2 is a sectional view taken along a line II-II shown in FIG. 1.

FIG. 1 and FIG. 2 show a semiconductor device according to a first embodiment, for example, a variable capacitor. FIG. 1 is a plan view, and FIG. 2 is a sectional view taken along a line II-II of FIG. 1.

In FIG. 1 and FIG. 2, for example, an insulating film 2 is formed on a semiconductor substrate 11 made of silicon. A lower electrode 13 is formed as a first electrode on this insulating film 12. The periphery of the lower electrode 13 is covered with an interlayer insulating film 14. The central portion of the lower electrode 13 is exposed from an opening 14a formed in the interlayer insulating film 14. A plurality of dummy patterns 15 of fine pillar shape are formed on the lower electrode 13 in the opening 14a.

An actuator layer 16 is formed over the opening 14a on the interlayer insulating film 14. The actuator layer 16 has a supporting portion 16-1 constituted, for example, by an insulating film at a central portion corresponding to the lower electrode 13. The actuator layer 16 has actuator portions 16-2 and 16-3 mechanically connected to the supporting portion 16-1 at both sides of this supporting portion 16-1. These actuator portions 16-2 and 16-3 are constituted by sequentially laminating an insulating film 16a, a first electrode 16b, a piezoelectric film 16c, a second electrode 16d, and an insulating film 16e. The first electrode 16b and the second electrode 16d apply a voltage to the piezoelectric film 16c.

An interlayer insulating film 17 is formed at the portion corresponding to the interlayer insulting film 14 on the actuator portions 16-2 and 16-3. An upper electrode 18 is formed as a second electrode at the portion corresponding to the lower electrode 13 on the supporting portion 16-1. A plurality of openings 19 which communicate with the opening 14a through the actuator portions 16-2 and 16-3 and the insulating film 17 are formed at the portion corresponding to the opening 14a in the actuator portions 16-2 and 16-3 arranged at both sides of the parallel side of the upper electrode 18 and the insulating film 17. Moreover, a plurality of openings 20 which communicate with the opening 14a through the supporting portion 16-1 are formed in the portion corresponding to the dummy patterns 15 of the upper electrode 18.

As the material of the piezoelectric film 16c, a ceramic piezoelectric material, such as PZT(Pb(Zr, Ti)O$_3$), AlN, ZnO, PbTiO, BTO(BaTiO$_3$) can be applied.

For the material of the lower electrode 16b and the upper electrode 16d which supply a voltage to the actuator layer 16, for example, it is possible to use, for example, (a) a material made of either one selected from the material group consisting of Pt, Sr, Ru, Cr, Mo, W, Ti, Ta, Al, Cu and Ni, (b) a nitride including at least one selected from the material group, (c) a conductive oxide including at least one selected from the material group (e.g., SrRuO), (d) a compound made of a material selected from the material group, and (e) one formed by laminating materials selected from (a) to (d).

As the material of the insulating films 16a and 16e, for example, a single layer made of SiN, a single layer made of SiO$_2$, a single layer made of Al$_2$O$_3$, a lamination layer made of SiN/SiO$_2$, a lamination layer made of SiN/Al$_2$O$_3$, etc., can be applied.

As the material of the first electrode 13 having a variable capacitor, for example, W, Al, Cu, Au, Ti, Pt, polysilicon, etc., can be applied. The W is preferable in order to reduce the resistance of the first electrode layer 13. Further, when the polysilicon is used as the material of the first electrode layer 13, it is desired to provide a silicide layer on the first electrode layer 13. In addition, as the material of the first electrode layer 13, any of Co, Ni, Si and N may be included.

As the material of the second electrode 18, for example, W, Al, Cu, etc., can be applied.

The materials of the first electrode 13 and the second electrode 18 may be formed of the same material, or may be formed of different materials. Further, the lower electrode 16b and the upper electrode 16d of the actuator portions 16-2 and 16-3 may be formed of the same material or different materials. The insulating film 16a under the lower electrode 16b and the insulating film 16e on the upper electrode 16d may be formed of the same material or different materials.

FIG. 3 shows the state that a voltage is applied to the actuator layer 16. When a voltage is applied to the actuator layer 16, the central portion of the actuator layer 16 is deformed in the direction of the lower electrode 13. In association with this, the dummy patterns 15 insert into each opening 20. FIG. 3 shows the state of the maximum capacity that the upper electrode 18 is driven by the actuator layer 16 and contacts the lower electrode 13. FIG. 2 shows the state of the minimum capacity.

The method of manufacturing the variable capacitor will be described by using FIG. 4 to FIG. 21.

First, as shown in FIG. 4, the insulating film 12 is formed on the substrate 1. The insulating film 12 is, for example, a silicon oxide film. The lower electrode 13 is formed of the above material on the insulating film 12.

Figure 6:
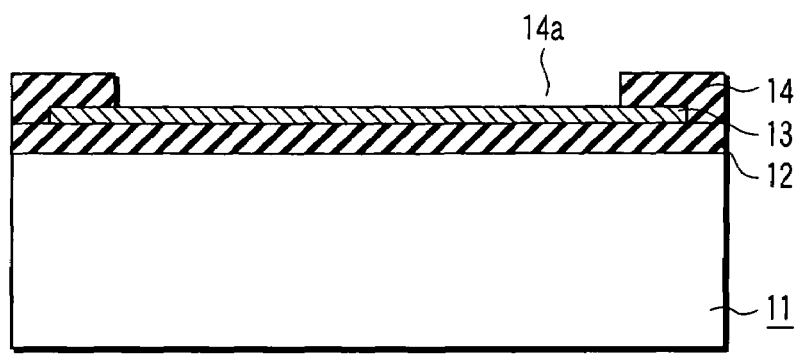
FIG. 6 is a sectional view showing a manufacturing process following FIG. 5.

Subsequently, as shown in FIG. 5, the interlayer insulating film 14 is formed, for example, using a TEOS on the whole surface. Thereafter, as shown in FIG. 6, the interlayer insulating film 14 is etched by RIE, and the opening 14a is formed.

Figure 7:
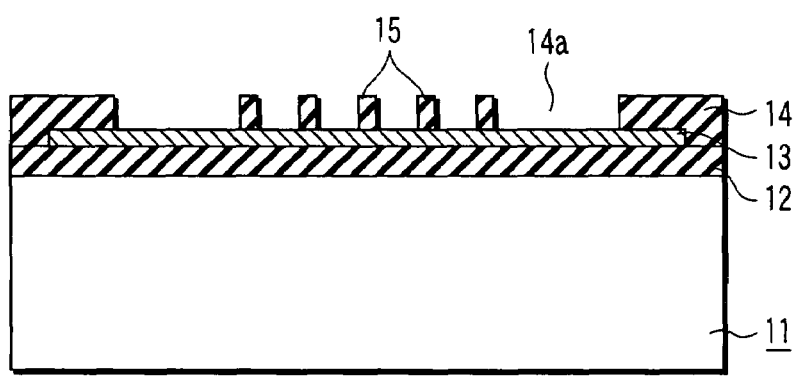
FIG. 7 is a sectional view showing a manufacturing process following FIG. 6.

Then, as shown in FIG. 7, for example, a plurality of dummy patterns 15 are formed of a silicon nitride film on the lower electrode 13 exposed by the opening 14a. That is, for example, an electrically inactive material, such as a silicon nitride film is deposited in the opening 14a. Then, a resist pattern corresponding to the dummy patterns 15 is formed. Thereafter, with the resist pattern as a mask, the silicon nitride film is etched by RIE. Thus, the dummy patterns 15 are formed.

The forming positions of the dummy patterns 15 are substantially central portions of the opening 14a. The number of the dummy patterns is of the degree that dishing may not occur on the filling material as a sacrificial layer, in a later CMP process, and may be of the degree that the areas of the lower and upper electrodes are not be reduced. Therefore, at least one dummy pattern may be formed at the central portion of the opening 14a. Further, the height of the dummy patterns 15 may be of the degree substantially equal to or slightly higher than the height of the interlayer insulating film 14. Thus, a severe accuracy is not required.

Figure 8:
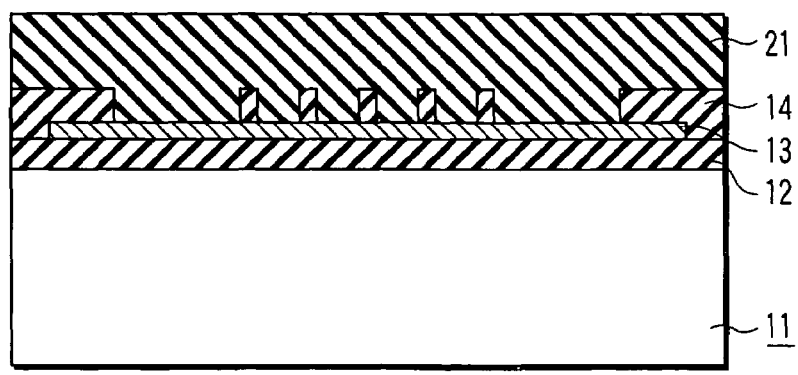
FIG. 8 is a sectional view showing a manufacturing process following FIG. 7.

Thereafter, as shown in FIG. 8, a filling material 21 is deposited on the whole surface. The material of this filling material 21 may obtain a sufficient selection ratio with the dummy patterns 15 and the lower electrode. For example, a polysilicon and an amorphous silicon can be applied.

As shown in FIG. 9, with the dummy patterns 15 and the interlayer insulating film 14 used as a stopper, the filling material 21 is planarized by the CMP. The opening 14a is filled by the filling material 21.

As shown in FIG. 10, the actuator layer 16 is formed on the filling material 21 and the interlayer insulating film 14. The actuator layer 16 is constituted of the supporting portion 16-1, and the actuator portions 16-2 and 16-3. On the actuator portions 16-2 and 16-3, as shown in FIG. 2, the insulating film 16a, the lower electrode 16b, the piezoelectric film 16c, the upper electrode 16d, and the insulating film 16e are sequentially formed. Moreover, the supporting portion 16-1 is formed, for example, by removing the lower electrode 16b and the upper electrode 16d from the manufacturing process of the actuator portions 16-2 and 16-3. Alternatively, the insulating film 16a, the lower electrode 16b, the upper electrode 16d and the insulating film 16e are removed from the manufacturing process of the actuator portions 16-2 and 16-3, and the supporting portion 16-1 is formed only of the piezoelectric film 16c.

Figure 12:
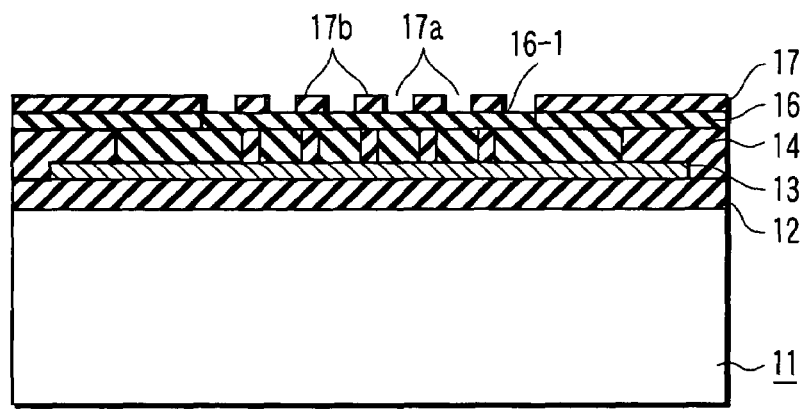
FIG. 12 is a sectional view showing a manufacturing process following FIG. 11.

Thereafter, as shown in FIG. 11, the interlayer insulating film 17 is formed on the actuator layer 16. Then, as shown in FIG. 12, the interlayer insulating film 17 is etched. Thereafter, a pattern for forming the upper electrode is formed. That is, in this pattern, a plurality of openings 17a for exposing the upper surface of the supporting portion 16-1 and mask portions 17b formed between these openings 17a are formed.

These mask portions 17b correspond to the dummy patterns 15, and become slightly larger patterns than the dummy patterns 15.

Figure 13:
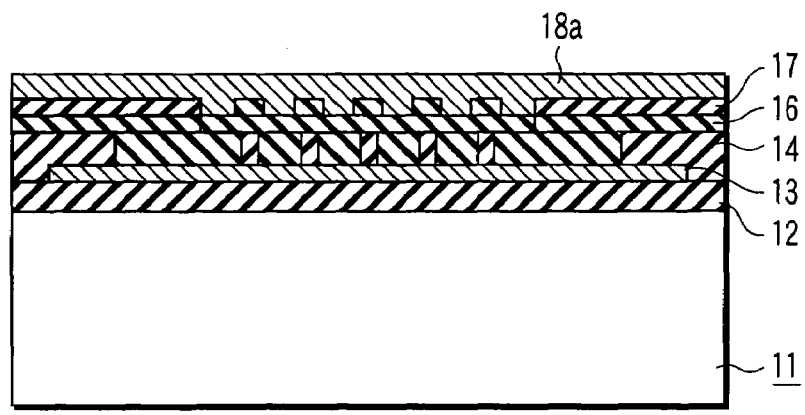
FIG. 13 is a sectional view showing a manufacturing process following FIG. 12.
Figure 14:
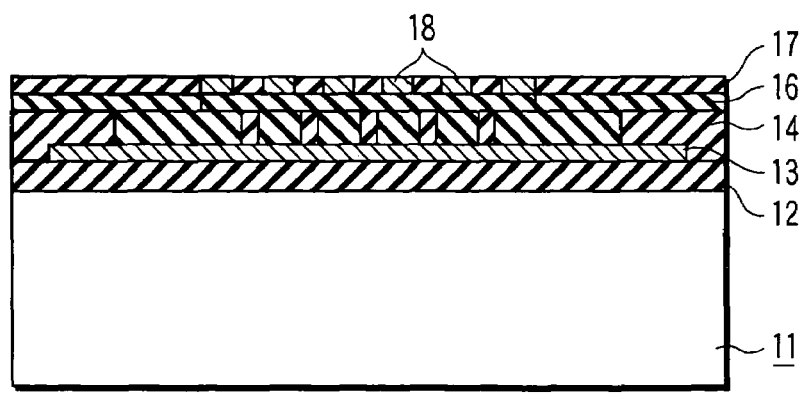
FIG. 14 is a sectional view showing a manufacturing process following FIG. 13.

As shown in FIG. 13, the electrode material 18a of the upper electrode 18 is formed on the interlayer insulating film. Thereafter, as shown in FIG. 14, the electrode material 18a is planarized by the CMP, and the upper electrode 18 is formed.

Figure 15:
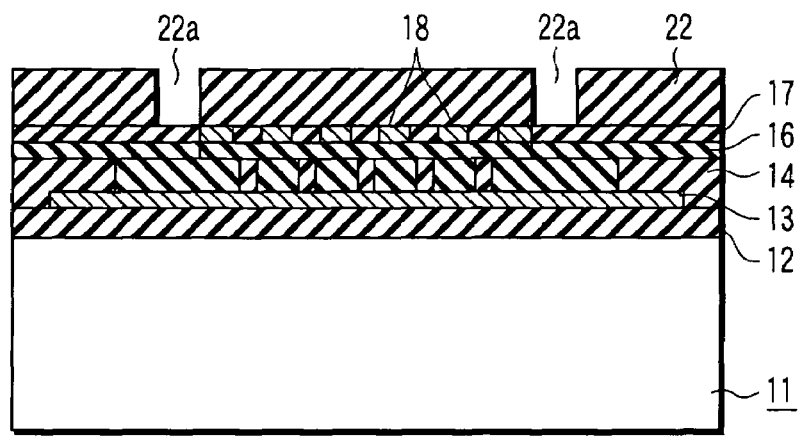
FIG. 15 is a sectional view showing a manufacturing process following FIG. 14.
Figure 16:
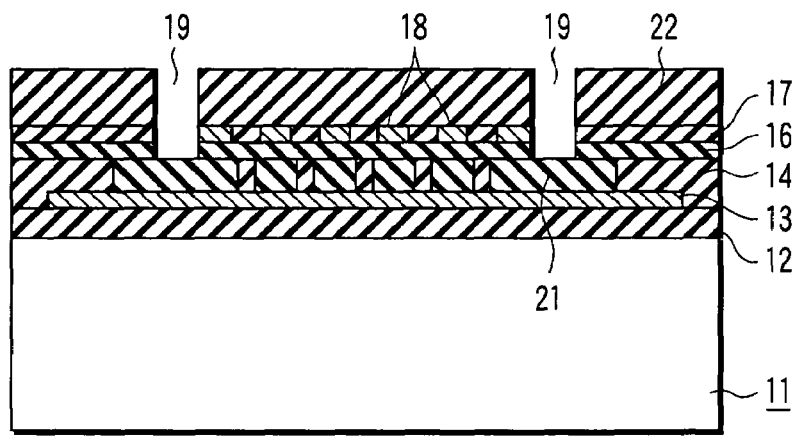
FIG. 16 is a sectional view showing a manufacturing process following FIG. 15.

Thereafter, as shown in FIG. 15, a resist pattern 22 is formed. This resist pattern 22 has opening patterns 22a corresponding to the openings 19 shown in FIG. 1 and FIG. 2. With the resist pattern 22 used as a mask, the portions of the interlayer insulating film 17 and the actuator layer 16 (actuator portion 16-2 and 16-3) are etched. As a result, as shown in FIG. 16, the openings 19 are formed.

Figure 17:
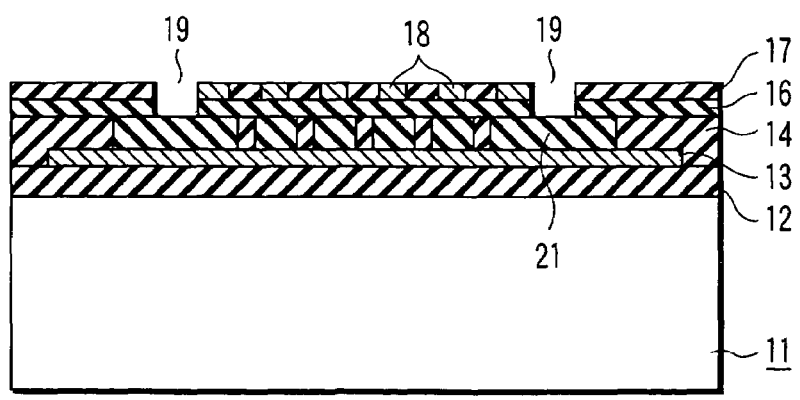
FIG. 17 is a sectional view showing a manufacturing process following FIG. 16.

Then, as shown in FIG. 17, the resist pattern 22 is removed.

Figure 18:
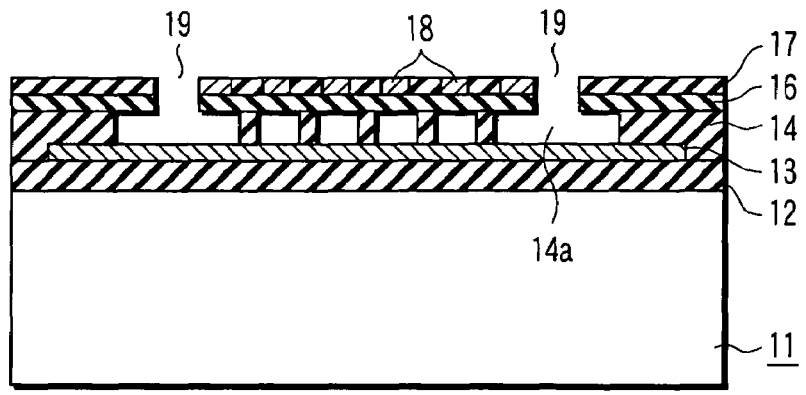
FIG. 18 is a sectional view showing a manufacturing process following FIG. 17.

Thereafter, as shown in FIG. 18, the filling material 21 is, for example, removed by wet etching through the openings 19, and the opening 14a is formed in the interlayer insulating film 14. The method of removing the filling material 21 is not limited to the wet etching. When the filling material 21 is, for example, polysilicon, the filling material 21 may be removed by using a chemical dry etching (CDE).

Figure 19:
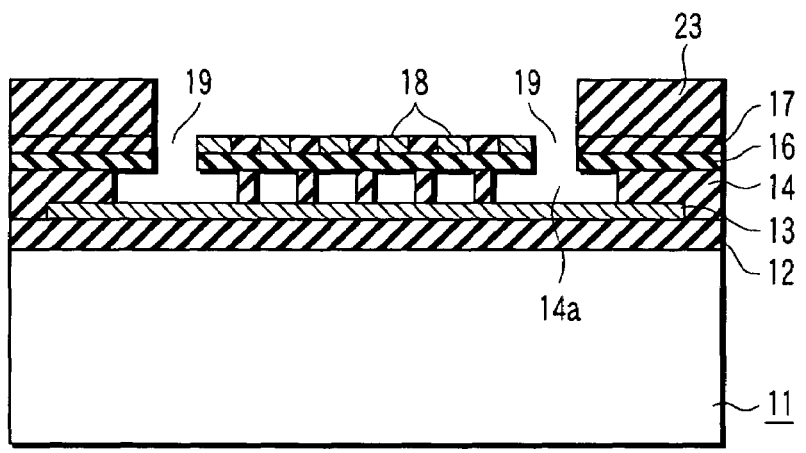
FIG. 19 is a sectional view showing a manufacturing process following FIG. 18.

Then, as shown in FIG. 19, a resist pattern 23 is formed on the region except the upper electrode 18 and the openings 19.

Figure 20:
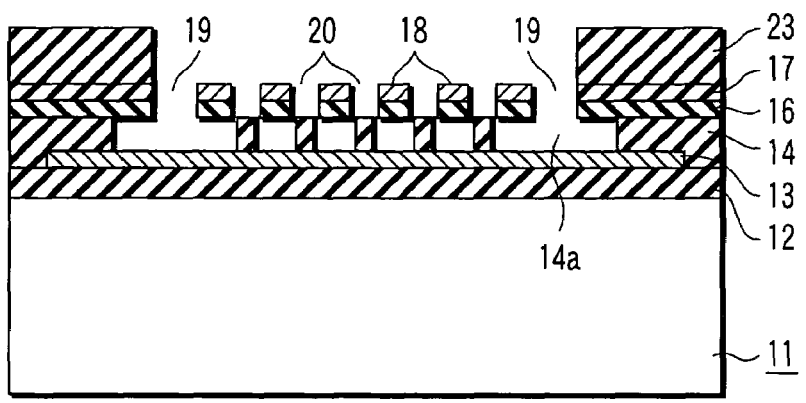
FIG. 20 is a sectional view showing a manufacturing process following FIG. 19.

As shown in FIG. 20, with this resist pattern 23 and the upper electrode 18 used as a mask, the interlayer insulating film 17 and the supporting portion 16-1 are removed, for example, by RIE. Then, the openings 20 corresponding to the dummy patterns 15 are formed. At the same time, both ends in the longitudinal direction of the opening 14a of the interlayer insulating film 17 and the actuator layer 16 are removed in parallel slightly inside from the width of the short dimension of the opening 14a. Therefore, as shown in FIG. 1, the actuator layer 16 is formed to cross over the opening 14a.

Figure 21:
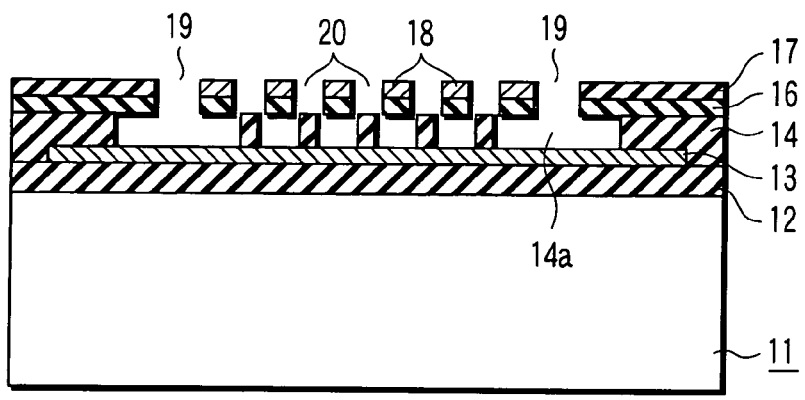
FIG. 21 is a sectional view showing a manufacturing process following FIG. 20.

Finally, as shown in FIG. 21, the resist pattern 23 is removed by, for example, ashing.

The above manufacturing method leaves the dummy patterns. However, the dummy patterns may be removed.

According to the first embodiment, the plurality of dummy patterns 15 are formed on the lower electrode 13. When the filling material is planarized by the CMP, it prevents dishing from occurring on the front surface of the filling material to be filled in the opening 14a. Therefore, the actuator layer 16 and the upper electrode 18 may be formed in parallel with the lower electrode 13, and the actuator layer 16 and the upper electrode 18 may be arranged separately at a predetermined distance from the lower electrode 13. Therefore, the variable capacitor having predetermined characteristics may be formed.

Furthermore, when the filling material is removed by wet etching, the actuator layer 16 is supported by the dummy patterns 15. Therefore, the occurrence of sticking may be prevented.

A plurality of the openings 19 and 20 are formed through the upper electrode 18 and the actuator layer 16. Therefore, the mass of the upper electrode 18 can be reduced. The inertial moment can be reduced. Moreover, the air moves through the openings 19 and 20 when the upper electrode 18 is driven. Accordingly, the air resistance can be reduced. Therefore, the driving force of the upper electrode 18 can be reduced, and the upper electrode 18 can be easily driven by a high frequency signal.

Further, the dummy patterns 15 have an effect as the guide of the upper electrode 18. Therefore, when the actuator layer 16 is driven, the vibration of the upper electrode 18 in a lateral direction can be suppressed. Thus, the mechanical and electrical characteristics can be improved.

Second Embodiment

Referring to FIG. 22 to FIG. 29, a second embodiment will be described.

In the first embodiment, the openings 20 are formed in the upper electrode 18. However, in the second embodiment, the openings 20 are not formed. In the second embodiment, the manufacturing process from FIG. 1 to FIG. 11 is similar to the first embodiment. Accordingly, the description will be omitted.

Figure 22:
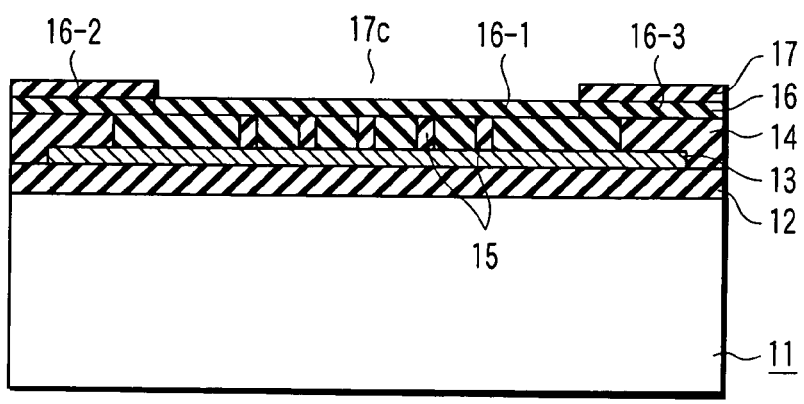
FIG. 22 is a sectional view showing a manufacturing process following FIG. 11, showing the method of manufacturing a semiconductor device according to a second embodiment.

In FIG. 22, an opening 17c is formed corresponding to the upper electrode forming region of the interlayer insulating film 17. The actuator layer 16 is exposed by this opening 17c.

Figure 23:
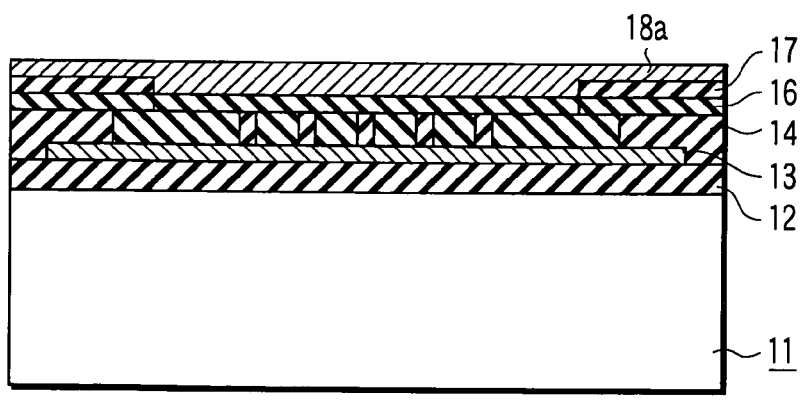
FIG. 23 is a sectional view showing the manufacturing method continued to FIG. 22.
Figure 24:
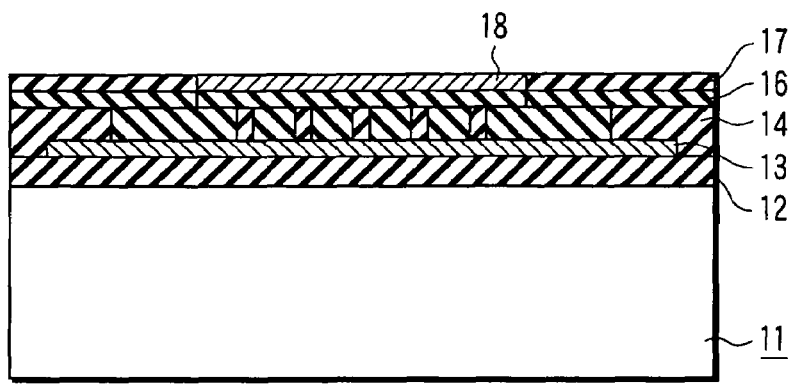
FIG. 24 is a sectional view showing a manufacturing process following FIG. 23.

Then, as shown in FIG. 23, the electrode material 18a of the upper electrode 18 is formed on the interlayer insulating film. Thereafter, as shown in FIG. 24, the electrode material 18a is planarized by the CMP. Then, the upper electrode 18 is formed.

Figure 25:
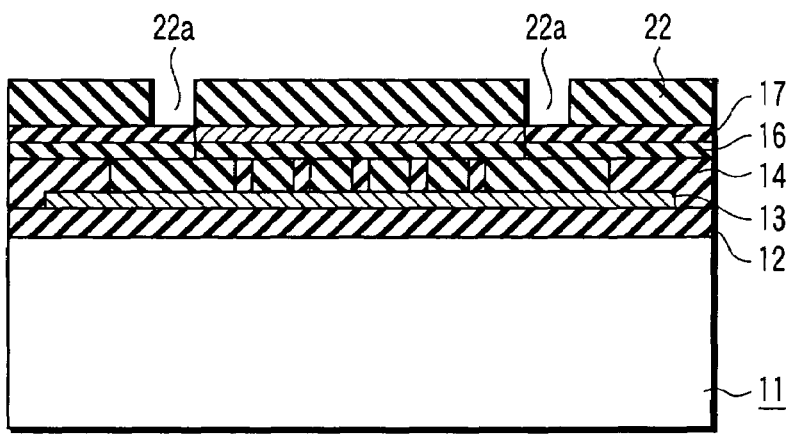
FIG. 25 is a sectional view showing a manufacturing process following FIG. 24.
Figure 26:
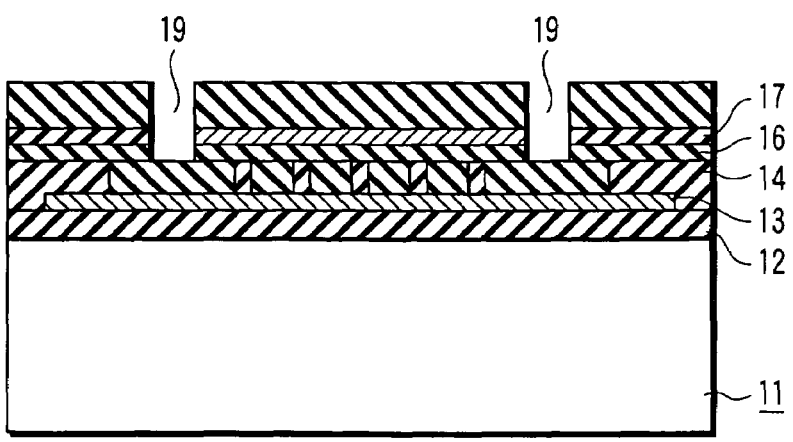
FIG. 26 is a sectional view showing a manufacturing process following FIG. 25.

Thereafter, as shown in FIG. 25, a resist pattern 22 is formed. The resist pattern 22 has opening patterns 22a corresponding to the openings 19 shown in FIG. 1 and FIG. 2. With this resist pattern 22 used as a mask, the portions of the interlayer insulating film 17 and the actuator layer 16 (actuator portions 16-2 and 16-3) are etched. As a result, as shown in FIG. 26, the openings 19 are formed.

Figure 27:
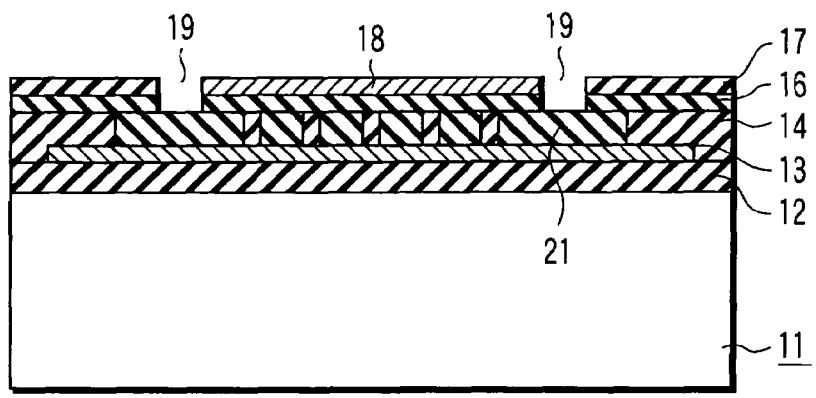
FIG. 27 is a sectional view showing a manufacturing process following FIG. 26.

Then, as shown in FIG. 27, the resist pattern 22 is removed.

Figure 28:
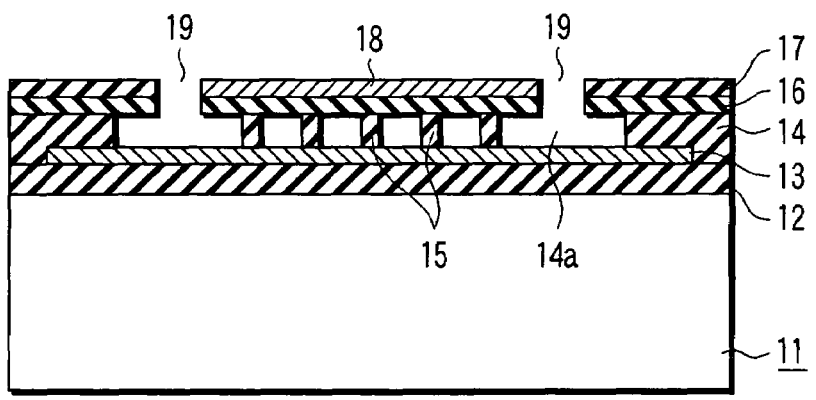
FIG. 28 is a sectional view showing a manufacturing process following FIG. 27.

Thereafter, as shown in FIG. 28, the filling material 21 is, for example, removed by wet etching through the openings 19. The opening 14a is formed in the interlayer insulating film 14. The removing method of the filling material 21 is not limited to the wet etching. When the filling material 21 is, for example, polysilicon, the filling material 21 can be removed by using chemical dry etching (CDE).

Figure 29:
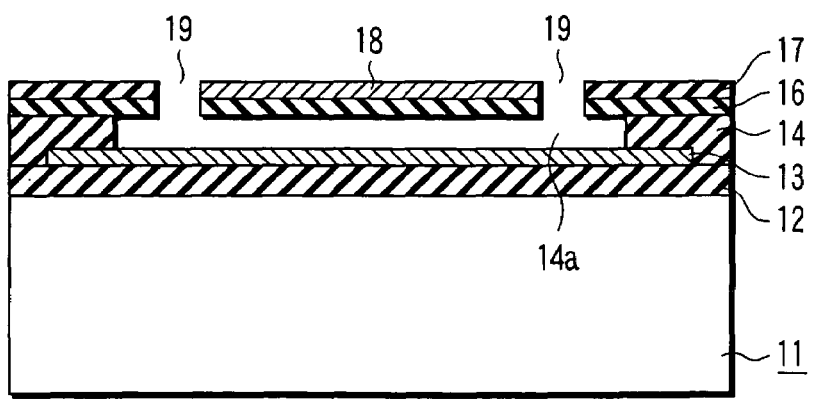
FIG. 29 is a sectional view showing a manufacturing process following FIG. 28.

Then, as shown in FIG. 29, the dummy patterns 15 in the opening 14a are removed, for example, by the CDE using a $CF_4$ gas.

With the second embodiment also, the dummy patterns 15 are formed in the opening 14a. Therefore, when the filling material 21 is planarized by the CMP, the occurrence of dishing can be prevented by the dummy patterns 15.

Moreover, in the case of the second embodiment, the upper electrode 18 does not have openings 20. Accordingly, the effective area of the upper electrode 18 can be increased. Therefore, the capacity can be increased.

Further, the actuator layer 16 has the openings 19. Accordingly, the inertial moment can be reduced. Moreover, air moves through the openings 19 when the actuator layer 16 is driven. Thus, the air resistance can be reduced. Therefore, the driving force of the upper electrode 18 can be reduced, and the upper electrode 18 can be easily driven by the high frequency signal.

(Modification)

FIG. 30 shows a modification. The first and second embodiments shows the case that the present invention is applied to the variable capacitor. On the contrary, FIG. 30 shows the example in which the first embodiment is applied, for example, to a relay.

In FIG. 30, an upper electrode 31 is formed oppositely to the lower electrode 13 on the lower surface of the actuator layer 16. In such a configuration, by applying a voltage to the actuator layer 16 and driving the actuator layer 16, the upper electrode 31 can be set to an on state in which the upper electrode 31 is contacted with the lower electrode 13, or to an off state in which the upper electrode 31 is separated from the lower electrode 13.

The manufacturing method of the relay is similar to the first and second embodiments. After the filling material 21 is planarized, the upper electrode 18 is formed. Then, the actuator layer 16 is formed.

With this modification also, the front surface of the filling material 21 can be planarized. Accordingly, the upper electrode 18 and the lower electrode 13 can be held in parallel with each other.

Further, the actuator layer 16 has the openings 20 the inertial moment can be reduced. The air moves through the openings 20 when the actuator layer 16 is driven. Accordingly, the air resistance can be reduced. Therefore, the driving force of the upper electrode 18 can be reduced, and the upper electrode 18 can be easily driven by the high frequency signal.

In FIG. 30, the dummy patterns 15 can be removed. Further, the openings 20 can be removed.

The variable capacitor shown in the first and second embodiments is assembled, for example, with an inductor. Then, a filter circuit in which a cutoff frequency can be varied can be constituted. Further, the first and second embodiments can be applied to a transducer, etc.

The lower electrode 13 and the upper electrode 18 are removed from the configurations shown in the first and second embodiments. The present semiconductor device can be used as a mere actuator. In this case, the actuator layer 16 is coupled to another part, and this part is driven by the actuator layer.

When the semiconductor device is used as an actuator, the forming step of the lower electrode 13 and the upper electrode 18 may be removed from the manufacturing process of the first and second embodiments.

Further, the dummy patterns 15 can be formed in a lattice shape, as shown, for example, in FIG. 31. In FIG. 31, the dummy pattern 15 can be removed from the final structure. In this case, the openings 20 are formed differently to the second embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising:
   a first electrode formed on a semiconductor substrate;
   a second electrode formed separately from the first electrode, the second electrode having at least one opening; and
   an actuator layer coupled to the second electrode, the actuator layer driving the second electrode toward the first electrode,
   wherein at least one dummy pattern is located below the opening and inserted in the opening of the second electrode when the second electrode is driven by the actuator layer.

2. The device according to claim 1, wherein the dummy pattern is formed between the first electrode and the second electrode.

3. The device according to claim 1, wherein the actuator layer comprises:
   a supporting portion coupled to the second electrode; and
   an actuator portion coupled to the supporting portion.

4. The device according to claim 3, wherein the actuator portion includes:
a piezoelectric film; and
third and fourth electrodes for applying a voltage to the piezoelectric film.

5. The device according to claim 4, wherein the piezoelectric film is configured by one of PZT(Pb(Zr, Ti)O$_3$), AlN, ZnO, PbTiO, or BTO(BaTiO$_3$).

6. The device according to claim 4, wherein an electrode of the actuator portion is configured by a material selected from:
(a) a material group consisting of Pt, Sr, Ru, Cr, Mo, W, Ti, Ta, Al, Cu and Ni,
(b) a nitride including at least one selected from the material group,
(c) a conductive oxide including at least one selected from the material group,
(d) a compound made of a material selected from the material group, and
(e) one formed by laminating materials selected from (a) to (d).

7. A variable capacitor configured by the device according to claim 1.

8. A switch configured by the device according to claim 1.

9. The device according to claim 1, wherein the dummy pattern has a pillar shape.

10. A device, comprising:
a first electrode disposed on a semiconductor substrate;
a second electrode disposed at a predetermined distance from the first electrode, wherein the second electrode has at least one opening;
an actuator layer coupled to the second electrode, wherein the actuator layer is configured to drive the second electrode toward the first electrode; and
at least one dummy pattern positioned beneath the at least one opening and configured to enter the at least one opening when a voltage is applied to the actuator layer to drive the second electrode.

11. The device of claim 10, wherein the dummy pattern is positioned between the first electrode and the second electrode when the actuator layer is not actuated, and is configured to enter the opening when the actuator layer is actuated.

12. The device of claim 10, wherein the actuator layer comprises:
a supporting portion coupled to the second electrode; and
an actuator portion coupled to the supporting portion.

13. The device of claim 12, wherein the actuator portion includes:
a piezoelectric film; and
third and fourth electrodes for applying a voltage to the piezoelectric film.

14. The device of claim 13, wherein the piezoelectric film comprises at least one of PZT(Pb(Zr, Ti)O$_3$), AlN, ZnO, PbTiO, or BTO(BaTiO$_3$).

15. The device of claim 13, wherein one of the third or fourth electrode comprises at least one of:
(a) a material group consisting of Pt, Sr, Ru, Cr, Mo, W, Ti, Ta, Al, Cu, and Ni,
(b) a nitride including at least one selected from the material group,
(c) a conductive oxide including at least one selected from the material group,
(d) a compound made of a material selected from the material group, and
(e) a material formed by laminating at least one selected from (a) to (d).

16. The device of claim 10, wherein the dummy pattern is configured to substantially fit into the opening when the voltage is applied to the actuator layer.

17. The device of claim 10, configured as a switch.

18. A variable capacitor, comprising:
a first electrode disposed on a semiconductor substrate;
a second electrode disposed at a distance from the first electrode, wherein the second electrode has an opening;
an actuator layer coupled to, and configured to drive, the second electrode toward the first electrode; and
a dummy pattern disposed over the first electrode and beneath the opening, the dummy pattern being configured to enter the opening when a voltage is applied to the actuator layer causing the distance to decrease.

19. The variable capacitor of claim 18, wherein the dummy pattern is positioned between the first electrode and the second electrode when the actuator layer is not actuated, and enters the opening when the actuator layer is actuated.

* * * * *